United States Patent
Huang et al.

(10) Patent No.: US 11,856,702 B2
(45) Date of Patent: Dec. 26, 2023

(54) ADAPTER BOARD, METHOD FOR MANUFACTURING THE SAME AND CIRCUIT BOARD ASSEMBLY USING THE SAME

(71) Applicant: SHENNAN CIRCUITS CO., LTD., Shenzhen (CN)

(72) Inventors: Lixiang Huang, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 48 days.

(21) Appl. No.: 17/463,575

(22) Filed: Sep. 1, 2021

(65) Prior Publication Data

US 2023/0007778 A1    Jan. 5, 2023

Related U.S. Application Data

(63) Continuation of application No. PCT/CN2021/103808, filed on Jun. 30, 2021.

(51) Int. Cl.
*H05K 1/18* (2006.01)
*H05K 1/14* (2006.01)

(52) U.S. Cl.
CPC ............ *H05K 1/186* (2013.01); *H05K 1/144* (2013.01); *H05K 2201/09481* (2013.01);
(Continued)

(58) Field of Classification Search
CPC .... H05K 1/11; H05K 1/14; H05K 1/141–147; H05K 1/18;
(Continued)

(56) References Cited

U.S. PATENT DOCUMENTS 6,512,182 B2 * 1/2003 Takeuchi ............... H05K 1/185
29/841
7,889,510 B2 * 2/2011 Takeuchi ............. H05K 1/0268
361/795
(Continued)

FOREIGN PATENT DOCUMENTS

CN       107452689 A    12/2017
CN       110010500 A     7/2019
(Continued)

OTHER PUBLICATIONS

International search report of the International Search Authority, International Application No. PCT/CN2021/103808 dated Mar. 28, 2022(8 pages).

*Primary Examiner* — Tuan T Dinh

(57) ABSTRACT

The present disclosure provides an adapter board, a for manufacturing the same and a circuit board assembly. The adapter board includes a board body, a first component buried in the board body, a first connector located on a first surface of the board body and configured to be connected with a circuit board and a second component, a second connector located on a second surface of the board body and configured to be connected with a second component, a first conductive body and a second conductive body buried in the board body. One end of the first conductive body is connected with the first component. The other end of the first conductive body is connected with the first connector. One end of the second conductive body is connected with the first component. The other end of the second conductive body is connected with the second connector.

13 Claims, 3 Drawing Sheets

(52) U.S. Cl.
CPC .............. *H05K 2201/09509* (2013.01); *H05K 2201/1003* (2013.01); *H05K 2201/10015* (2013.01); *H05K 2201/10022* (2013.01)

(58) Field of Classification Search
CPC . H05K 1/181–187; H05K 2201/09481; H05K 2201/09509; H05K 2201/10015; H05K 2201/10022
USPC ........................ 361/764–767, 784, 790–795; 174/259–264
See application file for complete search history.

(56) References Cited

U.S. PATENT DOCUMENTS

| | | | | |
|---|---|---|---|---|
| 7,932,471 | B2* | 4/2011 | Yamamoto ............. | H01G 4/232 361/792 |
| 9,743,534 | B2* | 8/2017 | Tomikawa ............. | H05K 1/185 |
| 10,349,519 | B2* | 7/2019 | Kim ........................ | H05K 1/185 |
| 2006/0145328 | A1* | 7/2006 | Hsu ........................ | H05K 1/185 257/690 |
| 2008/0149384 | A1* | 6/2008 | Kawabe ................ | H05K 1/0219 174/265 |
| 2012/0080222 | A1* | 4/2012 | Kim ........................ | H01L 24/17 174/260 |
| 2013/0074332 | A1* | 3/2013 | Suzuki ................... | H05K 1/185 29/834 |
| 2014/0185257 | A1* | 7/2014 | Hsu ........................ | H05K 1/186 361/761 |
| 2015/0359096 | A1* | 12/2015 | Hsu ..................... | H01L 23/5389 361/761 |

FOREIGN PATENT DOCUMENTS

| | | |
|---|---|---|
| CN | 110010502 A | 7/2019 |
| CN | 110854103 A | 2/2020 |
| JP | 2012212831 A | 11/2012 |

* cited by examiner

ADAPTER BOARD, METHOD FOR MANUFACTURING THE SAME AND CIRCUIT BOARD ASSEMBLY USING THE SAME

CROSS-REFERENCE TO RELATED APPLICATIONS

The present disclosure is a continuation-application of International (PCT) Patent Application NO. PCT/CN2021/103808 filed Jun. 30, 2021, the contents of all of which are hereby incorporated by reference.

TECHNICAL FIELD

The present disclosure generally relates to circuit boards, and in particular, to an adapter board, a method for manufacturing the same and a circuit board assembly using the same.

BACKGROUND

The adapter board is used to make a upper circuit board and a lower circuit board being electrically connected with each other, or make a circuit board and an electronic component being electrically connected with each other. With development of technology, electronic devices become miniaturized and lighter to meet needs of users.

In prior art, in order to make the adapter board have a variety of functions, a plurality of components are mounted on surfaces of the adapter board by solder paste welding, and then the adapter board is encapsulated by ball grid array (BGA) packaging technology on the surfaces of the adapter board. However, the method of mounting components on the surfaces of the adapter board through solder paste not only occupies mounting area of the adapter board surface, but also increases thickness of the adapter board.

SUMMARY

The present disclosure provides an adapter board, a method for manufacturing the same and a circuit board assembly using the same to effectively improve surface utilization of the adapter board.

In order to solve the above technical problems, the present disclosure provides an adapter board. The adapter board includes a board body, a first component buried in the board body, a first connector, a second connector a first conductive body and a second conductive body. The first connector is located on a first surface of the board body, and configured to be connected with a circuit board and a second component. The second connector is located on a second surface of the board body opposite to the first side, and configured to be connected with a second component. The first conductive body is buried in the board body. One end of the first conductive body is connected with the first component, and the other end of the first conductive body is connected with the first connector. The second conductive body is buried in the board body. One end of the second conductive body is connected with the first component, and the other end of the second conductive body is connected with the second connector.

In order to solve the above technical problems, the present disclosure also provides a circuit board assembly. The circuit board assembly includes a circuit board, a adapter board and a second component laminated in sequence. The adapter board is the adapter board according to the above embodiment.

In order to solve the above technical problems, the present disclosure also provides a method for manufacturing a adapter board. The method includes providing a board body preform; burying a first component in a board body formed by the board body preform; forming a first conductive body in the board body and extending from a first surface of the board body, wherein one end of the first conductive body is connected with the first component; forming a second conductive body in the board body and extending from a second surface of the board body away from the first surface of the board body, wherein one end of the second conductive body is connected with the first component; applying a first connector on a first surface of the board body to be connected with the first conductive body, wherein the first connector is configured to be connected with a circuit board; and applying a second connector on a second surface of the board body to be connected with the second conductive body, wherein the other end of the second connector is configured to be connected with a second component.

BRIEF DESCRIPTION OF THE DRAWINGS

In order to clearly explain the technical solutions in the embodiments of the present disclosure, the drawings used in the description of the embodiments will be briefly described below. Obviously, the drawings in the following description are merely an embodiment of the present disclosure. For those of ordinary skill in the art, other drawings may also be obtained based on these drawings without any creative work.

DETAILED DESCRIPTION

Figure 1:
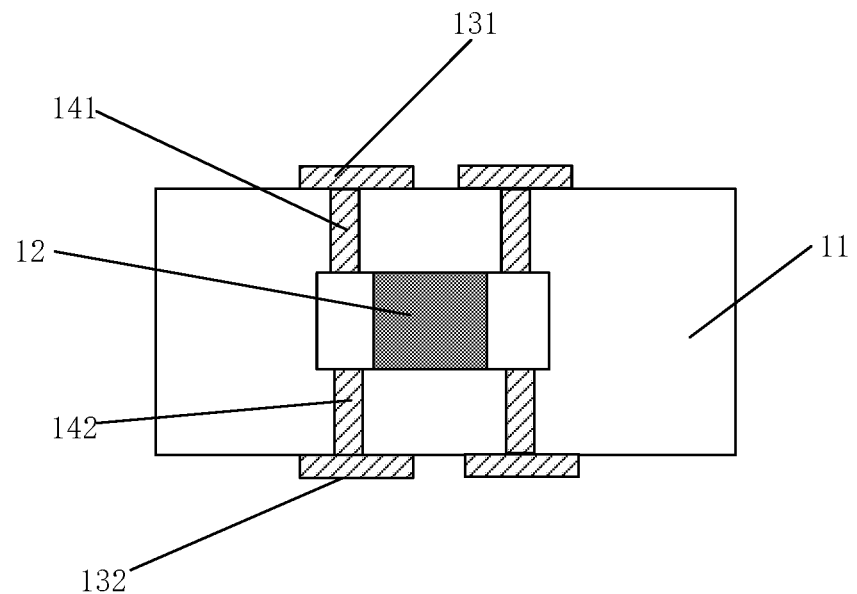
FIG. 1 is a structural schematic diagram of the adapter board according to an embodiment of the present disclosure.

The disclosure will now be described in detail with reference to the accompanying drawings and examples. Apparently, the described embodiments are only a part of the embodiments of the present disclosure, not all of the embodiments. All other embodiments obtained by those skilled in the art based on the embodiments of the present invention without creative efforts shall fall within the protection scope of the present invention.

It should be noted that all directional indications (such as up, down, left, right, front, rear, etc.) in the embodiments of the present disclosure are only used to explain the relative positional relationship between the components in a certain posture (as shown in the drawings), sports situations, etc. If the specific posture changes, the directionality indication also changes accordingly. Further, the terms "include" and "have" and any variants thereof are intended to cover non-exclusive inclusions. For example, a process, method, system, product, or device that comprises a series of steps or components is not limited to the listed steps or components, but may optionally include steps or components that are not listed, or alternatively may include other steps or components inherent these processes, methods, products, or devices.

In the specification, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" means two or more than two, unless specified otherwise.

Reference to "embodiments" herein means that specific features, structures or characteristics described the embodiments may be included in at least one embodiment of the present disclosure. The presence of the term in various places in the description does not necessarily refer to the same embodiment, nor is it an independent or alternative embodiment mutually exclusive with other embodiments. It is explicitly and implicitly understood by those skilled in the art that the embodiments described herein may be combined with other embodiments.

An adapter board is provided by the present disclosure. Please referring to FIG. 1, FIG. 1 is a structural schematic diagram of the adapter board according to an embodiment of the present disclosure.

As shown in FIG. 1, the adapter board may include a board body 11, a first component 12, a first connector 131, a second connector 132, a first conductive body 141 and a second conductive body 142. The first component 12 is buried in the board body 11. The first connector 131 and the second connector 132 are respectively located on two opposite sides of the board body 11 in one-to-one correspondence, that is, the first connector 131 is located on a first surface of the board body 11 and the second connector 132 is located on a second surface of the board body 11 opposite to the first surface. The first connector 131 and the second connector 132 are configured to be connected with a circuit board and a second component in one-to-one correspondence, that is, when one of the first connector 131 and the second connector 132 is connected with the circuit board, the other one of the first connector 131 and the second connector 132 is connected with a second component. The first conductive body 141 and the second conductive body 142 both are buried in the board body 11 and extend in a thickness direction of the board body 11. One end of the first conductive body 141 is connected with the first component 12, the other end of the connecting body 141 is connected with the first connector 131. One end of the second conductive body 142 is connected with the first component 12 and the other end of the second conductive body 142 is connected with the second connector 132.

In one embodiment, the first component 12 is buried in the board body 11 by the method of: forming a receiving room in the adapter board, placing the first component 12 in the receiving room, and arranging the first conductive body 141 and the second conductive body 142 on two opposite sides of the receiving room respectively in one-to-one correspondence. The receiving room can be a recess or hole such as through hole.

Each of the first conductive body 141 and the second conductive body 142 is a conductive hole formed on a single-layer sub-board or formed on laminated multilayer sub-boards.

Figure 2:
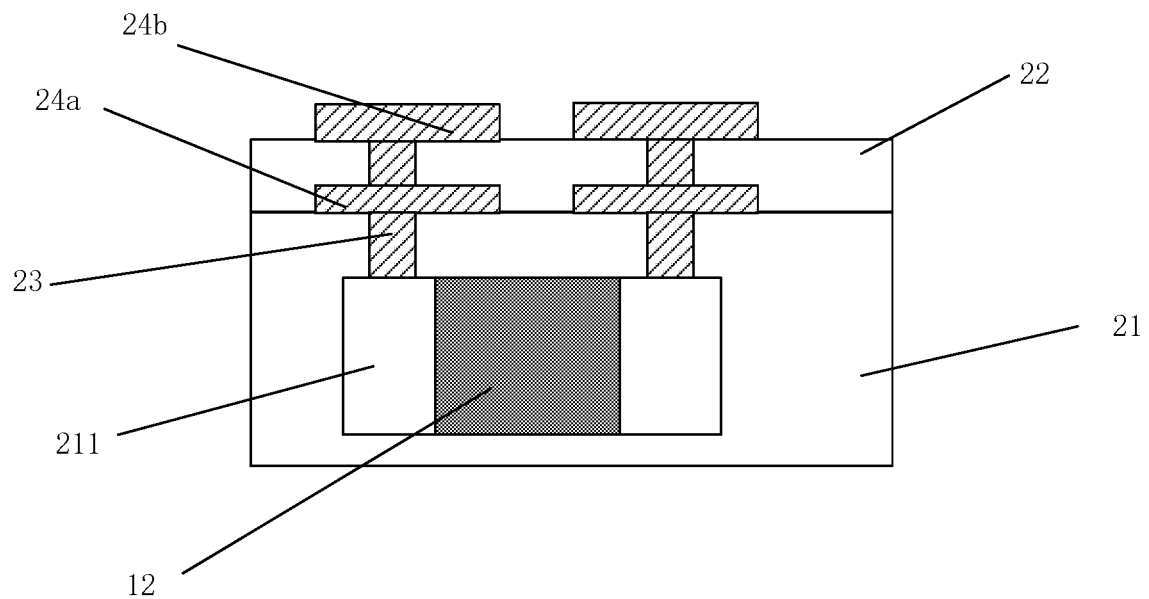
FIG. 2 is a structural schematic diagram of a conductive hole formed on laminated multilayer sub-boards in FIG. 1 according to an embodiment.

In one embodiment, the adapter board may include at least two laminated sub-boards, such as a first sub-board 21 and a second sub-board 22, please referring to FIG. 2 for details. FIG. 2 is a structural schematic diagram of the conductive hole formed on laminated multilayer sub-boards in FIG. 1 according to an embodiment. As shown in FIG. 2, both the receiving room 211 and at least part of blind hole 23 are formed in one of the at least two sub-boards. In the embodiment, both the receiving room 211 and part of the blind hole 23 are formed in the first sub-board 21. The part of the blind hole 23 is formed on a side wall of the receiving room 211, communicated with the receiving room 211, and exposed to a side of the first sub-board 21. That is, the blind hole 23 extends through the second sub-board 22 to the first sub-board and is communicated with the receiving room 211. Meanwhile, the side of the first sub-board 21 is provided with a first fan-out pad 24a, and the part of the blind hole 23 is filled with conductive material such as metal, and electrically connected with both the first component 12 and the first fan-out pad 24a of the first sub-board respectively. A side of the second sub-board 22 away from the first sub-board 21 is also provided with a second fan-out pad 24b, the other part of the blind hole 23 is formed in the second sub-board 22, filled with conductive material such as metal, and electrically connected with both the second fan-out pad 24b of the second sub-board 22 and first the fan-out pad 24a of the first sub-board 21 respectively.

The second fan-out pad 24b of the second sub-board 22 is configured to be connected with fan-out pads of other sub-boards (not shown), connected with a first pad on a side of the second component, or connected with a second pad on a side of the circuit board. In the present embodiment, the second fan-out pad 24b of the second sub-board 22 may be used as the first connector 131 or the second connector 132. Alternatively, at least one of the first connector 131 and the second connector 132 may be manufactured on an outer surface of the second fan-out pad 24b.

Figure 3:
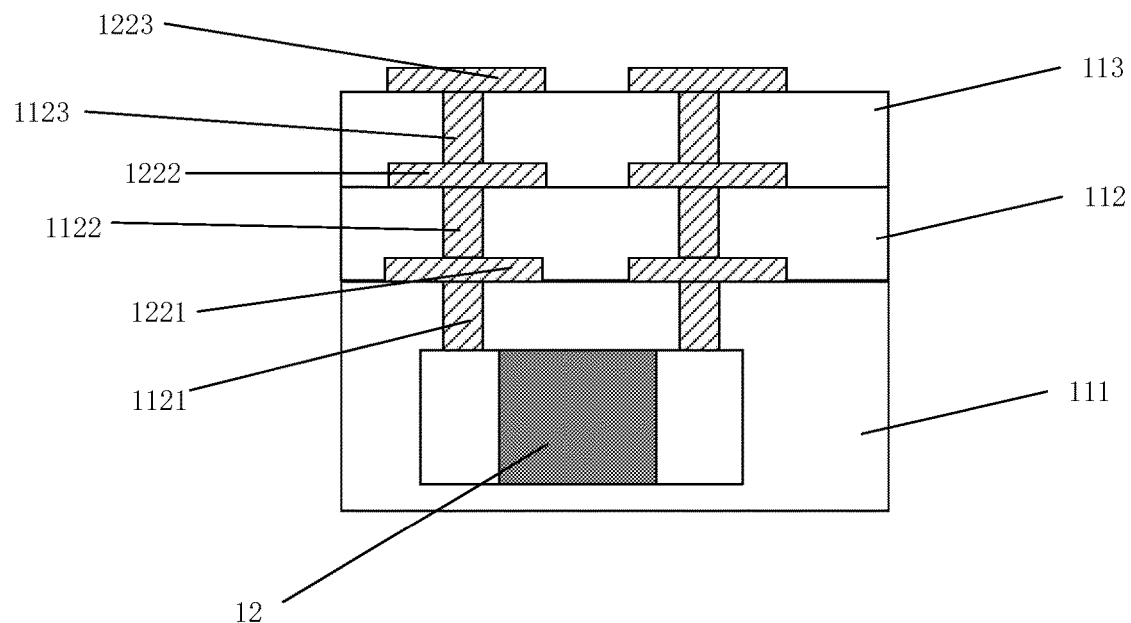
FIG. 3 is a structural schematic diagram of a connecting body in FIG. 1 according to an embodiment.

In another embodiment, the adapter board may include three sub-boards laminated in sequence, that is a first sub-board 111, a second sub-board 112 and a third sub-board 113. Please further referring to FIG. 3, FIG. 3 is a structural schematic diagram of the connecting body in FIG. 1 according to an embodiment. As shown in FIG. 3, both the receiving room and at least part of the blind hole are formed in the first sub-board 111. The blind hole may include a first sub-blind-hole 1121, a second sub-blind-hole 1122 and a third sub-blind-hole 1123 respectively formed in the first sub-board 111, the second sub-board 112 and the third sub-board 113 in one-to-one correspondence. That is, the first sub-blind-hole 1121 is formed in the first sub-board 111, the second sub-blind-hole 1122 is formed in the second sub-board 112, and the third sub-blind-hole 1123 is formed in the third sub-board 113. At least part of the first sub-blind-hole 1121 is formed on the first component 12, communicated with the first component 12 and exposed on a side of the first sub-board 111. The side of the first sub-board 111 is provided with a first fan-out pad 1221, and the first sub-blind-hole 1121 is filled with conductive material such as metal, and electrically connected with both the first fan-out pad 1221 and the first component 12 respectively. The first fan-out pad 1221 is configured to be connected with the second sub-blind-hole 1122 formed in the second sub-board 112. At least part of the second sub-blind-hole 1122 is formed on the first fan-out pad 1221, communicated with the first fan-out pad 1221 and exposed on a side of the second sub-board 112 facing the third sub-board 113. A side of the second sub-board 112 away from the first sub-board 111 is provided with a second fan-out pad 1222. The second sub-blind-hole 1122 is filled with conductive material such as metal, and electrically connected with the second fan-out pad 1222 and the first fan-out pad 1221 respectively. The second fan-out pad 1222 is configured to be connected with the third sub-blind-hole 1123 formed in the third sub-board 113. At least part of the third sub-blind-hole 1123 is formed on the second fan-out pad 1222, communicated with the second fan-out pad 1222 and exposed on a side of the third sub-board 113 away from the second sub-board 112. The third sub-board 113 is provided with a third fan-out pad 1223 on the side away from the second sub-board 112. The third sub-blind-hole 1123 is filled with conductive material such as metal, and electrically connected with the second fan-out pad 1222 and the third fan-out pad 1223 respectively. The third fan-out pad 1223 is configured to be connected with the first pad on the side of the second component or the second pad on the side of the circuit board. In other embodiments, a fourth sub-board, a fourth sub-blind-hole and a fourth fan-out pad can be located on a side of the third sub-board 113 away from the second sub-board 112 in sequence, and the number of layers of a sub-board is not limited here. It should be noted that in the above embodiment, when the fan-out pad is only located on a side of the fourth sub-board away from the third sub-board 113, at least part of the second sub-blind-hole 1122 is connected with the first sub-blind-hole 1121, and at least part of the third sub-blind-hole 1123 is connected with the first blind hole 1122. The fan-out pad can also be located on a side of each sub-board, then, at least part of the second sub-blind-hole 1122 is connected with the first fan-out pad 1221, and at least part of the third sub-blind-hole 1123 is connected with the second fan-out pad 1222, and there are no limitation here. The fan-out pad can be configured to convert signals in one channel into signals in multiple channels outflow or transmit signals from one channel to another channel outflow. In the present embodiment, the fan-out pad of the third sub-board 113 may be used as the first connector 131 or the second connector 132. Alternatively, at least one of the first connector 131 and the second connector 132 may be manufactured on an outer surface of the fan-out pad of the third sub-board 113. In the embodiment, the first sub-blind-hole 1121, the second sub-blind-hole 1122 and the third sub-blind-hole 1123 form the first conductive body 141 or the second conductive body 142. Shapes of the first sub-blind-hole 1121, the second sub-blind-hole 1122 and the third sub-blind-hole 1123 may include trapezoid or rectangle, and there are no limitations here.

Processes for manufacturing a blind hole and a through hole are different, the through hole is formed by drilling through the whole board body and filled with conductive material to conduct two opposite sides of the board body. However, the blind hole is formed by drilling only through a single sub-board or some laminated sub-boards of the board body to conduct two opposite sides of the single sub-board or the laminated sub-boards of the board body. In the above embodiment, the first sub-board 111, the second sub-board 112 and the third sub-board 113 are connected with each other by lamination. The first fan-out pad 1221 is included between the first sub-board 111 and the second sub-board 112. The second fan-out pad 1222 is included between the second sub-board 112 and the third sub-board 113. In another embodiment, PP boards are also included between the first sub-board 111 and the second sub-board 112 and between the second sub-board 112 and the third sub-board 113. The first sub-board 111, the second sub-board 112 and the third sub-board 113 are connected through laminated PP boards.

In the above embodiment, the connecting body is formed by the blind hole formed on laminating multilayer sub-boards to realize conduction between the first connector 131 or the second connector 132 and the first component 12. In some embodiments, fan-out pads between sub-boards are connected and conducted through a laser drilling blind hole process and by filling conductive material in the blind hole.

In the above embodiment, the third fan-out pad 1223 may include the first connector 131 and the second connector 132. That is, some of the third fan-out pad 1223 may be used as the first connector 131 and the second connector 132.

In the embodiment, the first component 12 may also include a first pin and a second pin. The first pin is connected with the first connector 131 through the first conductive body 141, and the second pin is connected with the second connector 132 through the second conductive body 142.

The number of first components 12 is at least one. In a preferred embodiment, a plurality of first components 12 may be buried in the board body 11 of the adapter board, and there are no limitations here.

Alternatively, the first component 12 may be a passive component such as a capacitive component, an inductive component or a resistive component, the second component may be a BGA board, and the circuit board is a PCB motherboard.

In the embodiment, the adapter board may also include a third connector and a fourth connector respectively located on two opposite sides of the board body in one-to-one correspondence and configured to be respectively connected with the circuit board and the third component in one-to-one correspondence. That is, the third connector is located on the first surface of the board body and the fourth connector is located on the second surface of the board body away from the third connector. The third component can be a BGA board or other active or passive components, and there are no limitations here. The adapter board may also include a third conductive body extending through the adapter board, one end of the third conductive body is connected with the third connector, and the other end of third conductive body is connected with the fourth connector. The third connector and the fourth connector may be the same as or different from the first connector 131 and the second connector 132, and there are not limitations here. The first connector 131, the second connector 132, the third connector and the fourth connector can be all connecting pads.

Beneficial effects of the embodiment are as follows. The first component is connected with the first connector through the first conductive body and connected with the second connector through the second conductive body. Thus the first component in the board body can be respectively connected with the first connector on the first surface of the board body and the second connector on the second surface of the board body to realize conduction of the adapter board. The first component is mounted in the board body of the adapter board, so that mounting area of adapter board surfaces is saved and extra mounting area can be used to mount more and larger BGA integrated chips. Easily lossy components are integrated into board body of the adapter board, thus improving reliability and reducing probability of component failure caused by secondary welding of original structures. In addition, an inner side and and outer side of the board body are connected with each other by drilling blind hole through a laser, thus reducing direct-current resistance of a conductive network compared with a connection method of integrating the components on the surface of the adapter board by soldering.

Figure 4:
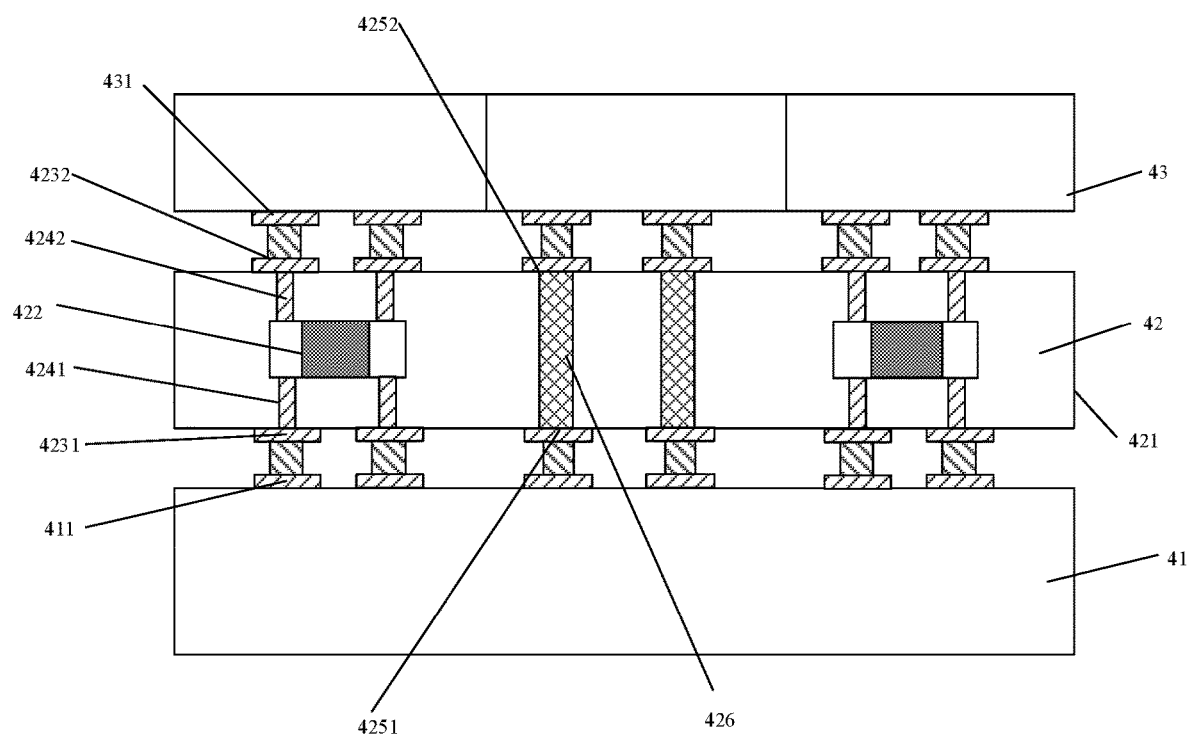
FIG. 4 is a structural schematic diagram of a circuit board assembly according to an embodiment of the present disclosure.

The present disclosure also provides a circuit board assembly, please referring to FIG. 4 for details. FIG. 4 is a structural schematic diagram of the circuit board assembly according to the embodiment of the present disclosure. As shown in FIG. 4, the circuit board assembly may include a circuit board 41, an adapter board 42 and a second component 43 laminated in sequence. The adapter board 42 may be the adapter board in any of the above embodiments. In some embodiments, the adapter board 42 may include a board body 421, a first component 422, a first connector 4231, a second connector 4232, a first conductive body 4241 and a second conductive body. The first component 422 is buried in the board body 421. The first connector 4231 and the second connector 4232 are respectively located on two opposite sides of the board body in one-to-one correspondence, that is, the first connector 4231 is located on a first surface of the board body 11 and the second connector 4232 is located on a second surface of the board body 11 opposite to the first surface. The first connector 4231 and the second connector 4232 are configured to be respectively connected with the circuit board 41 and the second component 43 in one-to-one correspondence, that is, when one of the first connector 4231 and the second connector 4232 is connected with the circuit board, the other one of the first connector 4231 and the second connector 4232 is connected with a second component. The first conductive body 4241 and the second conductive body 4242 both extend in a thickness direction of the board body 421. One end of the first conductive body 4241 is connected with the first component 422, the other end of the first conductive body 4241 is connected with the first connector 4231. One end of the second conductive body 4242 is connected with the first component 422, and the other end of the second conductive body 4242 is connected with the second connector 4232.

The board body 421 of the adapter board 42 is provided with a receiving room, and the first component 422 is placed in the receiving room. Each of the first conductive body 4241 and the second conductive body 4242 is a conductive blind hole formed on a single-layer sub-board or formed on laminated multilayer sub-boards. In a specific embodiment, the adapter board 42 includes at least two laminated sub-boards, such as a first sub-board and a second sub-board. Both the receiving room and part of the blind hole are formed in one of the at least two sub-boards, such as the first sub-board. The part of the blind hole is formed on the first component 422, communicated with the first component 422 and exposed to one side of the one of the at least two sub-boards, such as the first sub-board. Meanwhile, the one side of the one of the sub-boards is provided with a first fan-out pad. The part of the blind hole is respectively connected with the first fan-out pad and the first component 422. One side of the other sub-board, such as the second sub-board, away from the one sub-board, such as the first sub-board, is also provided with a second fan-out pad, and the other part of the blind hole is located in the other sub-board, such as the second sub-board, and respectively connected with the second fan-out pad of the other sub-board, such as the second sub-board, and the second fan-out pad of the one of the at least two sub-boards, such as the first sub-board. The second fan-out pad of the other sub-board is connected with fan-out pads of other sub-boards, or with a first pad 431 of the second component 43 or a second pad 411 on the side of the circuit board 41. Fan-out pads on outer sides of the board body 421 may include a first connector 4231 and a second connector 4232.

In one embodiment, each of the first conductive body 4241 and the second conductive body 4242 is a conductive blind hole formed on laminated multilayer sub-boards. For example, the adapter board 42 may include three sub-boards laminated in sequence, that is, the first sub-board, the second sub-board and the third sub-board. Each of the first conductive body 4241 and the second conductive body 4242 may include a blind hole drilled by the laser in the first sub-board, the second sub-board and the third sub-board. Both the receiving room and at least part of the blind hole are formed in the first sub-board, and at least part of the blind hole are formed in the first sub-board, the second sub-board and the third sub-board respectively. At least part of the blind hole is formed on the first component 422, communicated with the first component 422 and exposed on a side of the first sub-board facing to the second sub-board. The side of the first sub-board is provided with a first fan-out pad, and part of the blind hole in the first sub-board is connected with the first fan-out pad and the first component 422. The first fan-out pad is configured to be connected with part of the blind hole formed in the second sub-board. At least part of the blind hole is formed on the first fan-out pad, communicated with the first fan-out pad and exposed on a side of the second sub-board facing the third sub-board. The second sub-board is provided with a second fan-out pad on a side of the second sub-board away from the first sub-board. Part of the blind hole in the second sub-board is respectively connected with the second fan-out pad and the first fan-out pad. The second fan-out pad is configured to be connected with part of the blind hole in the third sub-board. At least part of the blind hole is formed on the second fan-out pad, communicated with the second fan-out pad and exposed on a side of the third sub-board away from the second sub-board. The third sub-board is provided with a third fan-out pad on the side of the third sub-board away from the second sub-board. Part of the blind hole is respectively connected with the second fan-out pad and the third fan-out pad. The third fan-out pad is also configured to be connected with the first pad on the side of the second component or the second pad on the side of the circuit board. In other embodiments, a fourth sub-board, a fourth sub-blind-hole and a fourth fan-out pad can be located on a surface of the third sub-board in sequence, and the number of layers of sub-board is not limited here. The fan-out pad can be configured to convert signals in one channel into signals in multiple channels outflow or transmit signals from one channel to another channel outflow. In the embodiment, the fan-out pad on an outermost layer the board body 421 may be used as the first connector 131 or the second connector 132. Alternatively, at least one of the first connector 131 and the second connector 132 may be manufactured on an outer surface of an outermost layer the fan-out pad. In the embodiment, shapes of the blind hole may include trapezoid or rectangle, and there are no limitations here. The first conductive body 4241 and the second conductive body 4242 are conductive hole formed on a single-layer sub-board or laminated multilayer sub-boards.

Alternatively, the second component 43 may include a plurality of BGA boards and/or passive components connected adjacent or spaced from each other, and there are no limitations here. The first component 422 may be a passive component, including an inductive component, a capacitive component, a resistive component, etc., and the circuit board 41 includes a PCB motherboard.

The number of the first pad 431 and the number the second pad 411 may be multiple. A plurality of pads are respectively located on the second component 43 and the circuit board 41, and the plurality of pads are spaced from each other.

In one embodiment, the first component 422 may include a first pin and a second pin respectively connected with the first conductive body 4241 and the second conductive body 4242 in one-to-one correspondence. That is, the first pin is connected with the first conductive body 4241 and the second pin is connected with the second conductive body 4242.

The adapter board may also include a third connector 4251 and a fourth connector 4252 respectively located on two opposite sides of the board body 11 in one-to-one correspondence and configured to be connected with the circuit board 41 and the third component 44 in one-to-one correspondence. That is the third connector 4251 is located on a side of the board body 11 and configured to be connected with the circuit board 41, and the fourth connector 4252 is located on a side of the board body 11 away from the third connector 4251 and configured to be connected with the third component 44. The third component 44 may include a BGA board or a passive component, etc. The adapter board 42 may include a third conductive body 426 extending through the adapter board 42, one end of the third conductive body 426 is connected with the third connector 4251, and the other end of the third conductive body 426 is connected with the fourth connector 4252. The third connector 4251 and the fourth connector 4252 may be the same as or different from the first connector 4231 and the second connector 4232, and there are no limitations here. The first connector 4231, the second connector 4232, the third connector 4251 and the fourth connector 4252 can be connection pads.

Beneficial effects of the embodiment are as follows. The first component is buried in the board body of the adapter board, and the first conductive body and the second conductive body are located on two opposite sides of the first component respectively to make the first connector on the first surface of the of the board body and the second connector on the second surface of the board body be conducted through the first conductive body and the second conductive body. Meanwhile, the first pad of the second component is connected with the first connector of the adapter board and the second pad on the side of the circuit board is connected with the second connector on the second surface of the board body by laminating the circuit board, the adapter board and the second component in sequence, so that the circuit board and the second component are conducted through the adapter board. On the other hand, mounting area of of the adapter board surfaces is saved by mounting the first component in the board body of the adapter board, so that extra mounting area can be used to mount more and larger BGA integrated chips. Easily lossy components are integrated into the board body of the adapter board, thus improving reliability and reducing probability of component failure caused by the secondary welding of the original structure. In addition, an inner side and outer side of the board body are connected with each other by drilling blind hole through a laser, thus reducing direct-current resistance of a conductive network compared with a connection method of integrating the components on the surface of the adapter board by soldering.

Figure 5:
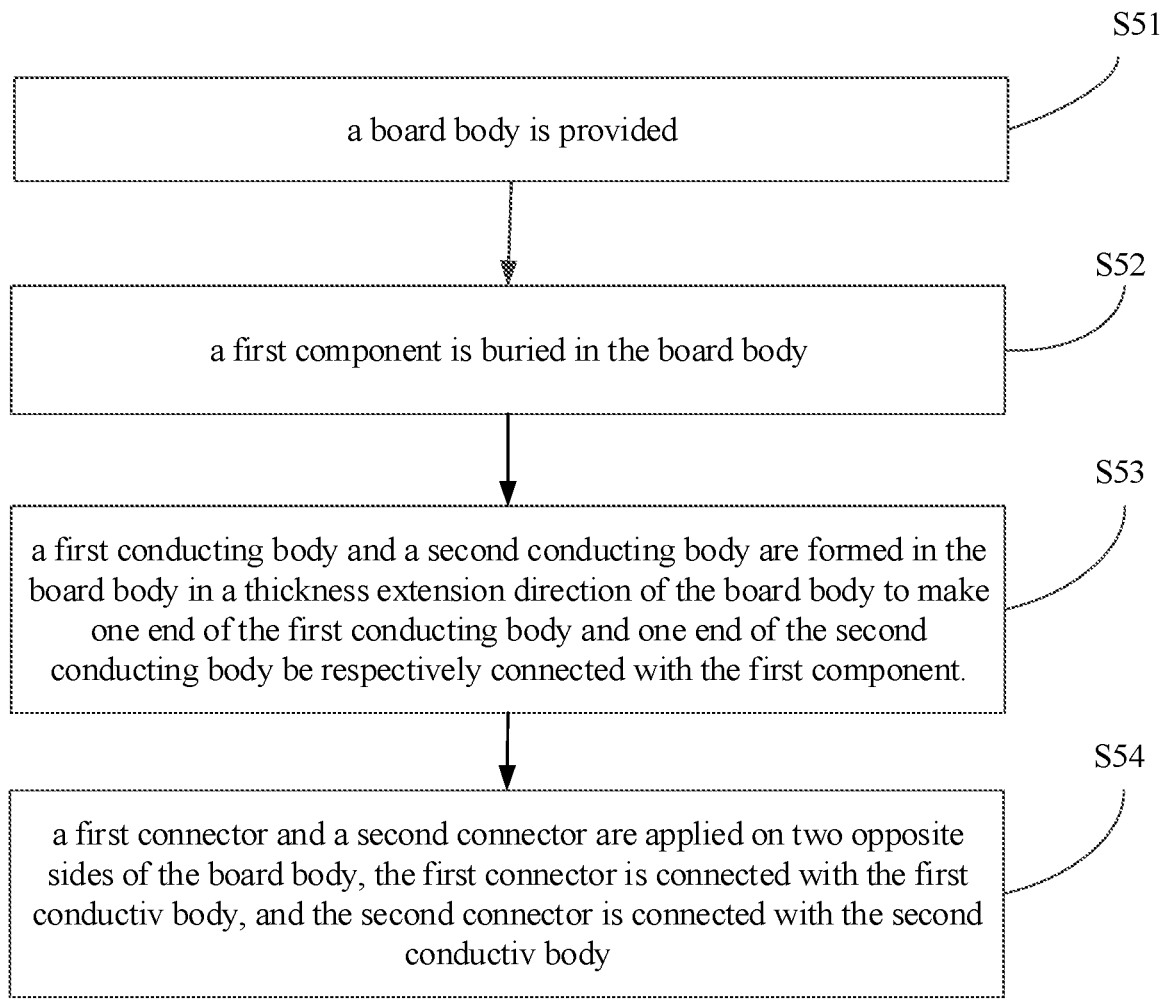
FIG. 5 is a flow chart of a method for manufacturing an adapter board according to an embodiment of the present disclosure.

The application also provides a method for manufacturing the adapter board. Please referring to FIG. 5, FIG. 5 is a flow chart of the method for manufacturing the adapter board of according to of an embodiment of the present disclosure. As shown in FIG. 5, the method may include the following.

At block S51, a board body preform is provided.

Specifically, the board body preform may include a single-layer core board or multilayer core boards. The board body preform can be called as a sub-board.

At block S52, a first component is buried in a board body formed by the board body preform.

The first component may include passive components, such as capacitive components, inductive components, resistive components, etc. In one embodiment, operations at block S52 may include: forming a receiving room with two openings, such as a first opening and a second opening opposite to the first opening, in the board body preform, placing the first component in the receiving room, and laminating two dielectric layers on sides with the two openings of the receiving room respectively in-one-to-one correspondence, that is, laminating a first dielectric layer on a first surface of the board body preform with a first opening and laminating a second dielectric layer on a second surface of the board body preform with the second opening, to bury the first component in the board body formed by the board body preform. The board body may include the board body preform and the two dielectric layers.

In another embodiment, operations at block S52 may include: forming a receiving room in the board body preform, placing the first component in the receiving room, and covering at least two layer sub-boards on two opposite sides of the receiving room respectively. That is, the first side of the receiving room is covered with at least two layer sub-boards and the second side of the receiving room away from the first side of the receiving room is covered with at least two layer sub-boards. The board body may include the board body preform and at least four layer sub-boards. The sub-board and the dielectric layer can be the same or different, and there are no limitations here, and the number of layers of the sub-board is also not limited. In some embodiments, the dielectric layer may be a layer sub-board.

At block S53, a first conductive body and a second conductive body are formed in the board body in a thickness extension direction of the board body to make one end of the first conductive body and one end of the second conductive body be respectively connected with the first component. That is, the first conductive body is formed in the board body and extending from the first surface of the board body to the receiving room and one end of the first conductive body is connected with the first component, and the second conductive body is formed in the board body and extending from the second surface of the board body away from the first surface of the board body to the receiving room and one end of the second conductive body is connected with the first component.

In one embodiment, operations at block S53 may include: forming a first blind hole in the first dielectric layer and communicated with the receiving room to expose a part of the first component; filling the first blind hole with conductive material; forming a second blind hole in the second dielectric layer and communicated with the receiving room to expose another part of the first component; and filling the second blind hole with conductive material.

In another embodiment, operations at block S53 may include: covering the first side of the receiving room with at least two layer sub-board and covering the second side of the receiving room away from the first side of the receiving room with at least two layer sub-board; and forming a first blind hole in some adjacent sub-boards and communicated with the receiving room to expose a part of the first component, and forming a second blind hole in some other adjacent sub-boards away from the some adjacent sub-boards and communicated with the receiving room to expose another part of the first component.

A first conductive blind hole and a second conductive blind hole are respectively formed by filling conductive material into the first blind hole and the second blind hole at two opposite sides of the board body of the adapter board and conducted with the first component. That is, the first conductive blind hole is formed in the board body and extends from a side of the board body to the first component. A fan-out pad is located on a side of each sub-board away from the first component to make both ends of the first conductive blind hole and both ends of the second conductive blind hole are respectively connected with the fan-out pad and the first component. That is, part of the first conductive blind hole is connected with the fan-out pad and the other end of part of the first conductive blind hole is connected with the first component and other part of the first conductive blind hole is connected with two adjacent fan-out pads, and part of the second conductive blind hole is connected with the fan-out pad and the other end of part of the second conductive blind hole is connected with the first component and other part of the second conductive blind hole is connected with two adjacent fan-out pads. Thus the first conductive body and the second conductive body are respectively obtained. The fan-out pad is configured to be connected with another layer sub-board of the adapter board, or with the first pad on a side of the second component other than the adapter board, or with the second pad on the side of the circuit board.

In one embodiment, each of the first conductive body and the second conductive body is formed by a conductive blind hole formed in laminated multilayer sub-boards. A method for manufacturing the first conductive body and the second conductive body may include: covering upper and lower sides of the receiving room with a first sub-board respectively, drilling a first sub-blind-hole on the first sub-board, and a bottom of the first sub-blind-hole being connected with a pin of the first component, forming a first fan-out fan by plating copper on a side of the first sub-blind-hole away from the first sub-board to make the first fan-out pad be connected with the pin of the first component through the first sub-blind-hole; covering the first sub-board with a second sub-board, drilling a second sub-blind-hole on the second sub-board, a bottom of the second sub-blind-hole being connected with the side of the first sub-blind-hole or the first fan-out pad on the side of the first sub-blind-hole, and forming a second fan-out pad by electroplating on a side of the second sub-blind-hole away from the first sub-board to make the second fan-out pad and the first sub-blind-hole or the first fan-out pad on the side of the first blind hole be connected and conducted; covering a third sub-board on the second sub-board, drilling a third sub-blind-hole on the third sub-board, a bottom of the third blind hole being connected with the second sub-blind-hole or the second fan-out pad on the side of the second sub-blind-hole, and forming a third fan-out pad by electroplating on a side of the third sub-blind-hole away from the second sub-board to make the third fan-out pad and the second sub-blind-hole or the second fan-out pad on the side of the second sub-blind-hole be connected and conducted. The rest can be done in the same manner, multilayer sub-boards can be located on the third sub-board, and can be drilled and plated with copper to form connecting bodies, and there are no limitations here. In the embodiment, the board body of the adapter board is formed by pressing multilayer sub-boards. A PP layer can be also included between the sub-boards, and there are no limitations here. The first sub-board, the second sub-board and the third sub-board can be PCB boards, and there are no limitations here. It should be noted that processes for manufacturing the blind hole and a through hole are different. The through hole is formed by drilling through a whole board body and filled with conductive material conduct two opposite sides of the board body. However, the blind hole is formed by drilling a single sub-board or some laminated sub-boards of the board body to conduct two opposite sides of the single sub-board or the laminated sub-boards of the board body. In the embodiment, the first sub-blind-hole, the second sub-blind-hole and the third sub-blind-hole are made by drilling hole through a laser.

In one embodiment, the first sub-board, the second sub-board and the third sub-board may include a circuit graphics board, and signals between the circuit board and the second component can be transmitted to different circuit layers through the circuit graphics board of the first sub-board, the second sub-board and the third sub-board in the adapter board. In another embodiment, the signals between the circuit board and the second component can be shunted or converted to different circuit layers for transmission through the first component. The first component may include capacitive components, inductive components, resistive components, etc.

At block S54, a first connector and a second connector are applied on two opposite sides of the board body, the first connector is connected with the first conductive body, and the second connector is connected with the second conductive body. That is, the first connector is applied on the first surface of the board body to be connected with the first conductive body and the second connector is located on the second surface of the board body away from the first surface of the board body to be connected with the second conductive body.

The first and second connectors are also configured to be connected with the circuit board and the second component.

In one embodiment, operations at block S54 may include: locating the fan-out pads, such as a first fan-out pad and a second fan-out pad on the sides of the sub-boards away from the board body preform to obtain the first connector and the second connector, that is, locating the first fan-out pad on a side of an outermost sub-board of the board body away from the board body preform to obtain the first connector and locating the second fan-out pad on a side of another outermost sub-board of the board body away from the board body preform to obtain the second connector. In another embodiment, operations at block S54 may include: arranging the fan-out pads on sides of the sub-boards away from the board body preform, and arranging the first connector on a side of the first fan-out pad away from the sub-board and arranging the second connector on a side of the second fan-out pad away from the sub-board.

The first connector is connected with at least part of the blind hole in a sub-board, and the second connector is connected with at least part of the blind hole in another sub-board.

The circuit board may include a PCB motherboard, and the second component may include a BGA board. The first connector and the second connector may include connecting pads.

In one embodiment, the first component may also include a first pin and a second pin. The first pin is configured to be connected with the first conductive body and the second pin is configured to be connected with the second conductive body.

Beneficial effects of the embodiment are as follows. The first component is buried in the board body of the adapter board, the first component is connected with the first connector through the first conductive body and the second connector through the second conductive body to make the first connector on the first surface of the board body and the second connector on the second surface of the board body be conducted on the adapter board. Thus, mounting area of adapter board surfaces can be saved, extra mounting area can be used to mount more and larger BGA integrated chips. Moreover, easily lossy components are integrated into the adapter board, thus improving reliability and reducing probability of component failure caused by the secondary welding of the original structure. On the other hand, an inner side and an outer side of the adapter board are connected with each other by drilling blind hole through a laser, thus reducing direct-current resistance of a conductive network compared with a connection method of integrating the components on the surface of the adapter board by soldering.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. An adapter board, comprising:
a board body;
a first component buried in the board body;
a first connector located on a first surface of the board body, and configured to be connected with a circuit board and the first component;
a second connector located on a second surface of the board body opposite to the first side, and configured to be connected with a second component;
a first conductive body buried in the board body, wherein one end of the first conductive body is connected with the first component, and the other end of the first conductive body is connected with the first connector; and
a second conductive body buried in the board body, wherein one end of the second conductive body is connected with the first component, and the other end of the second conductive body is connected with the second connector;
wherein the board body is provided with a receiving room, and the first component is placed in the receiving room;
each of the first conductive body and the second conductive body is a conductive blind hole formed on laminated multilayer sub-boards; and
the board body comprises a first sub-board and a second sub-board laminated directly on the first sub-board, the receiving room is formed in the first sub-board, the conductive blind hole extends through the second sub-board to the first sub-board and comprises a first sub-blind-hole and a second sub-blind-hole, the first sub-blind-hole is formed in the first sub-board and communicated with the receiving room, the second sub-blind-hole is formed in the second sub-board, a side of the first sub-board away from the first component is provided with a first fan-out pad, the first sub-blind-hole is respectively connected with the first fan-out pad and the first component, and the first fan-out pad is configured to be connected with the second sub-blind-hole; and wherein the board body further comprises a third sub-board laminated on the second sub-board at a side away from the first sub-board, and the conductive blind hole further comprises a third sub-blind-hole extending through the second sub-board to the third sub-board and connected to the second sub-blind-hole; and
a side of the second sub-board away from the first sub-board is provided with a second fan-out pad configured to be connected with the third sub-blind-hole, and at least part of the third sub-blind-hole is formed on the second fan-out pad and exposed on a side of the third sub-board away from the second sub-board.

2. The adapter board according to claim 1, wherein the number of the first component is at least one.

3. The adapter board according to claim 1, wherein a side of second sub-board away from the first sub-board is provided with a second fan-out pad, part of the conductive blind hole formed in the second sub-board respectively connected with the second fan-out pad and the first fan-out pad, and the second fan-out pad is configured to be connected with part of the conductive blind hole formed in the second sub-board, a first pad on a side of the second component, or a second pad on a side of the circuit board.

4. The adapter board according to claim 1, wherein the first component comprises a passive component, the second component comprises a ball grid array packaging board, and the circuit board comprises a PCB master board.

5. The adapter board according to claim 1, further comprising:
a third connector located on the first surface of the board body, and configured to be connected with the circuit board; and
a fourth connector located on the second surface of the board body;
a third conductive body extending through the board body, wherein one end of the third conductive body is connected with the third connector and the other end of the third conductive body is connected with the fourth connector.

6. A circuit board assembly, comprising:
a circuit board, an adapter board and a second component laminated in sequence;
wherein the adapter board comprises:
a board body;
a first component buried in the board body;
a first connector, located on a first surface of the board body, and configured to be connected with a circuit board and the first component;
a second connector located on a second surface of the board body opposite to the first side, and configured to be connected with the second component;
a first conductive body buried in the board body, wherein one end of the first conductive body is connected with the first component, and the other end of the first conductive body is connected with the first connector; and
a second conductive body buried in the board body, wherein one end of the second conductive body is connected with the first component, and the other end of the second conductive body is connected with the second connector;
wherein the board body is provided with a receiving room, and the first component is placed in the receiving room;
each of the first conductive body and the second conductive body is a conductive blind hole formed on laminated multilayer sub-boards;

the board body comprises a first sub-board and a second sub-board laminated directly on the first sub-board, the receiving room is formed in the first sub-board, the conductive blind hole extends through the second sub-board to the first sub-board and comprises a first sub-blind-hole and a second sub-blind-hole, the first sub-blind-hole is formed in the first sub-board and communicated with the receiving room, the second sub-blind-hole is formed in the second sub-board, a side of the first sub-board away from the first component is provided with a first fan-out pad, the first sub-blind-hole is respectively connected with the first fan-out pad and the first component, and the first fan-out pad is configured to be connected with the second sub-blind-hole; and wherein the board body further comprises a third sub-board laminated on the second sub-board at a side away from the first sub-board, and the conductive blind hole further comprises a third sub-blind-hole extending through the second sub-board to the third sub-board and connected to the second sub-blind-hole; and a side of the second sub-board away from the first sub-board is provided with a second fan-out pad configured to be connected with the third sub-blind-hole, and at least part of the third sub-blind-hole is formed on the second fan-out pad and exposed on a side of the third sub-board away from the second sub-board.

7. The circuit board assembly according to claim 6, wherein the number of the first component is at least one.

8. The circuit board assembly according to claim 6, wherein the first component comprises a passive component, the second component comprises a ball grid array packaging board, and the circuit board comprises a PCB master board.

9. The circuit board assembly according to claim 6, further comprising:
   a third connector located on the first surface of the board body, and configured to be connected with the circuit board; and
   a fourth connector located on the second surface of the board body;
   a third conductive body extending through the board body, wherein one end of the third conductive body is connected with the third connector and the other end of the third conductive body is connected with the fourth connector.

10. A method for manufacturing an adapter board, comprising:
    providing a board body preform;
    burying a first component in a board body formed by the board body preform;
    forming a first conductive body in the board body and extending from a first surface of the board body, wherein one end of the first conductive body is connected with the first component;
    forming a second conductive body in the board body and extending from a second surface of the board body away from the first surface of the board body, wherein one end of the second conductive body is connected with the first component;
    applying a first connector on the first surface of the board body to be connected with the first conductive body, wherein the first connector is configured to be connected with a circuit board; and
    applying a second connector on the second surface of the board body to be connected with the second conductive body, wherein the other end of the second connector is configured to be connected with a second component;

wherein the burying the first component in the board body comprises:
    forming a receiving room in the board body, and placing the first component in the receiving room;
    covering at least two layer first sub-boards on the first surface of the board body preform; and
    covering at least two layer second sub-boards on the second surface of the board body preform; and
    the forming the first conductive body in the board body comprises:
    forming a first blind hole in the at least two first layer sub-boards on the first surface of the board body preform and communicated with the receiving room to expose a part of the first component; and
    filling the first blind hole with conductive material;
    the forming the second conductive body in the board body comprises:
    forming a second blind hole in the at least two second layer sub-boards on the second surface of the board body preform and communicated with the receiving room to expose another part of the first component; and
    filling the second blind hole with conductive material;
    the applying the first connector on the first surface of the board body to be connected with the first conductive body comprises:
    forming a first fan-out pads on each first sub-board to be connected with the first conductive body;
    wherein the first fan-out pad is configured to be connected with the second sub-blind-hole; and
    wherein the board body further comprises a third sub-board laminated on the second sub-board at a side away from the first sub-board, and the conductive blind hole further comprises a third sub-blind-hole extending through the second sub-board to the third sub-board and connected to the second sub-blind-hole; and
    a side of the second sub-board away from the first sub-board is provided with a second fan-out pad configured to be connected with the third sub-blind-hole, and at least part of the third sub-blind-hole is formed on the second fan-out pad and exposed on a side of the third sub-board away from the second sub-board.

11. The method for manufacturing the adapter board according to claim 10, wherein the burying the first component in the board body comprises:
    forming a receiving room in the board body preform, and placing the first component in the receiving room;
    laminating a first dielectric layer on the first surface of the board body preform; and
    laminating a second dielectric layer on the second surface of the board body preform.

12. The method for manufacturing the adapter board according to claim 10, wherein
    the applying the second connector on the second surface of the board body to connect with the second conductive body comprises:
    forming a second fan-out pad on each second sub-board to be connected with the second conductive body;
    wherein the second fan-out pad is configured to be connected with another layer sub-board of the adapter board, a first pad on one side of the second component other than the adapter board, or a second pad on a side of the circuit board.

13. The method for manufacturing the adapter board according to claim 11, wherein the forming the first conductive body in the board body comprises:

forming a first blind hole in the first dielectric layer and communicated with the receiving room to expose a part of the first component;

filling the first blind hole with conductive material;

the forming the second conductive body in the board body comprises:

forming a second blind hole in the second dielectric layer and communicated with the receiving room to expose another part of the first component; and filling the second blind hole with conductive material.

* * * * *